United States Patent
Budzelaar

(10) Patent No.: US 6,252,567 B1
(45) Date of Patent: Jun. 26, 2001

(54) MULTI-OUTPUT DIGITAL TO ANALOG CONVERTER

(75) Inventor: Franciscus P. M. Budzelaar, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/291,429

(22) Filed: Apr. 13, 1999

(30) Foreign Application Priority Data

Apr. 15, 1998 (EP) .................................................. 98201197

(51) Int. Cl.[7] .................................................. G09G 3/20
(52) U.S. Cl. ................... 345/55; 345/94; 345/99; 345/100
(58) Field of Search ............... 345/98, 99, 100, 345/87, 77, 78, 94, 55

(56) References Cited

U.S. PATENT DOCUMENTS

| | | | |
|---|---|---|---|
| 4,766,430 | 8/1988 | Gillette | 340/793 |
| 5,400,028 * | 3/1995 | Schlig | 341/150 |
| 5,600,345 | 2/1997 | Dingwall et al. | 345/100 |
| 5,670,979 * | 9/1997 | Huq et al. | 345/100 |
| 5,684,487 * | 11/1997 | Timko | 341/172 |
| 5,889,485 * | 3/1999 | Schneider | 341/150 |

* cited by examiner

Primary Examiner—Steven Saras
(74) Attorney, Agent, or Firm—Bernard Franzblau

(57) ABSTRACT

In a multiple-output digital to analog converter, digital input data (Dd) is converted into a plurality of analog output voltages (Voi) across associated loads (Li). A timing generator (TG) generates time periods (Ti1) in dependence on the digital input data (Dd). A buffer (B1) has an output (O1) to supply a waveform (WF1) to the loads (Li) via a coupling circuit (S1i). The coupling circuit (S1i) couples a certain load (Li) to the buffer output (B1) during an associated time period (Ti1). The output voltage (Voi) across the certain load (Li) is related to a value of the waveform (Wf1) at the end of the associated time period (Ti1) when the coupling circuit decouples the load (Li) from the buffer output (O1).

The multiple-output digital to analog converter further comprises a plurality of dummy loads (Ldi), each one of the dummy loads (Ldi) is associated to a corresponding one of the loads (Li). The dummy loads (Ldi) are coupled to the buffer output (O1) when the corresponding load (Ldi) is decoupled from the buffer output (O1). A pre-setting circuit (B2, S2i) generates the voltages (Vdi) across the dummy loads (Ldi) so as to be substantially equal to the output voltages (Voi) across the associated loads (Li) occurring when the coupling circuit (S1i) decouples the load (Li) from the output buffer (B1).

11 Claims, 3 Drawing Sheets

MULTI-OUTPUT DIGITAL TO ANALOG CONVERTER

BACKGROUND OF THE INVENTION

The invention relates to a multiple-output digital to analog converter as defined in the precharacterizing part of claim 1. The invention further relates to a method of converting digital data into a plurality of analog output voltages as defined in the precharacterizing part of claim 8. The invention also relates to a matrix display with such a converter as defined in the precharacterizing part of claim 9.

Such a multiple-output digital to analog converter is known from prior art U.S. Pat. No. 4,766,430 which discloses a drive circuit for a liquid crystal display with a matrix of picture elements. Row select lines select the picture elements row by row and a drive circuit drives the picture elements in a selected row in parallel by supplying drive voltages via column data lines. The drive circuit receives an input information signal representative of the data to be displayed to supply digital brightness counts, individually indicative of brightness levels for each picture element, to counters, whereby there is one counter for each column of the display. Each counter is first loaded with the brightness count and subsequently starts counting down. The counter turns off a transfer gate the instant its count becomes zero. As long as the transfer gate is on, the associated picture element receives a ramping voltage generated by an analog waveform generator. The instant the count reaches zero, the transfer gate disconnects the picture element from the waveform generator and the voltage across the picture element is frozen. In this way, the brightness of the picture element is controlled by the brightness count loaded into the counter, and is determined by the value of the ramping voltage the instant the count reaches zero.

It is a drawback of the drive circuit or the multiple-output digital to analog converter which converts digital brightness counts into analog voltages across the picture elements that the ramping voltage is disturbed the instant a transfer gate disconnects a picture element. This disturbance is especially large if many picture elements have to display a same brightness. The disturbance of the ramping voltage causes a visible brightness error for picture elements which are disconnected only a short time later.

SUMMARY OF THE INVENTION

It is an object of the invention to provide a multi-output digital to analog converter with reduced disturbance of the ramping waveform.

To this end, a first aspect of the invention provides a multiple-output digital to analog converter as defined in claim 1. A second aspect of the invention provides a method of converting digital data into a plurality of analog output voltages as defined in claim 8. A third aspect of the invention provides a matrix display with a multiple-output digital to analog converter as defined in claim 9. Advantageous embodiments of the invention are defined in the dependent claims.

In a multiple-output digital to analog converter in accordance with the invention, digital input data is converted into a plurality of analog output voltages across associated loads. A buffer has an output to supply a waveform to the loads via a coupling circuit. The waveform may be generated by a ramp generator. A timing generator generates time periods in dependence on the digital data. The coupling circuit couples a specific load to the buffer output during an associated time period. The output voltage across the specific load is related to a value of the waveform at the end of the associated time period when the coupling circuit decouples the load from the buffer output. The coupling circuit may comprise a plurality of switching elements, each switching element is coupled between the output of the buffer and one of the loads. In this case, the timing generator converts the digital input data into a plurality of control signals determining the time periods during which corresponding switching elements are closed. The output voltages across one of the loads vary according to the waveform until an associated switching element opens.

The multiple-output digital to analog converter according to the invention further comprises at least one dummy load. When a plurality of dummy loads is applied, each one of the dummy loads is associated with a corresponding one of the loads. The dummy load is coupled to the buffer output when the corresponding load is decoupled from the buffer output. A pre-setting circuit generates the voltage across the dummy load so as to be substantially equal to the output voltage across the associated load occurring the instant the coupling circuit decouples the load from the output buffer. In this way, the load on the buffer output is substantially constant, and the waveform will not be disturbed by load changes if a load is decoupled from the buffer output. It is not necessary to add a dummy load for every load. The disturbance of the waveform at the buffer output decreases already if only a part of the number of loads which are decoupled at a same instant is associated with a corresponding dummy load which at the same instant is coupled to the buffer output.

In an embodiment of the invention, the number of dummy loads is equal to the number of loads, so that the load on the buffer output is substantially constant.

BRIEF DESCRIPTION OF THE DRAWINGS

These and other aspects of the invention will be apparent from and elucidated with reference to the accompanying drawings.

In the drawings.

DESCRIPTION OF THE PREFERRED EMBODIMENTS

Figure 1:
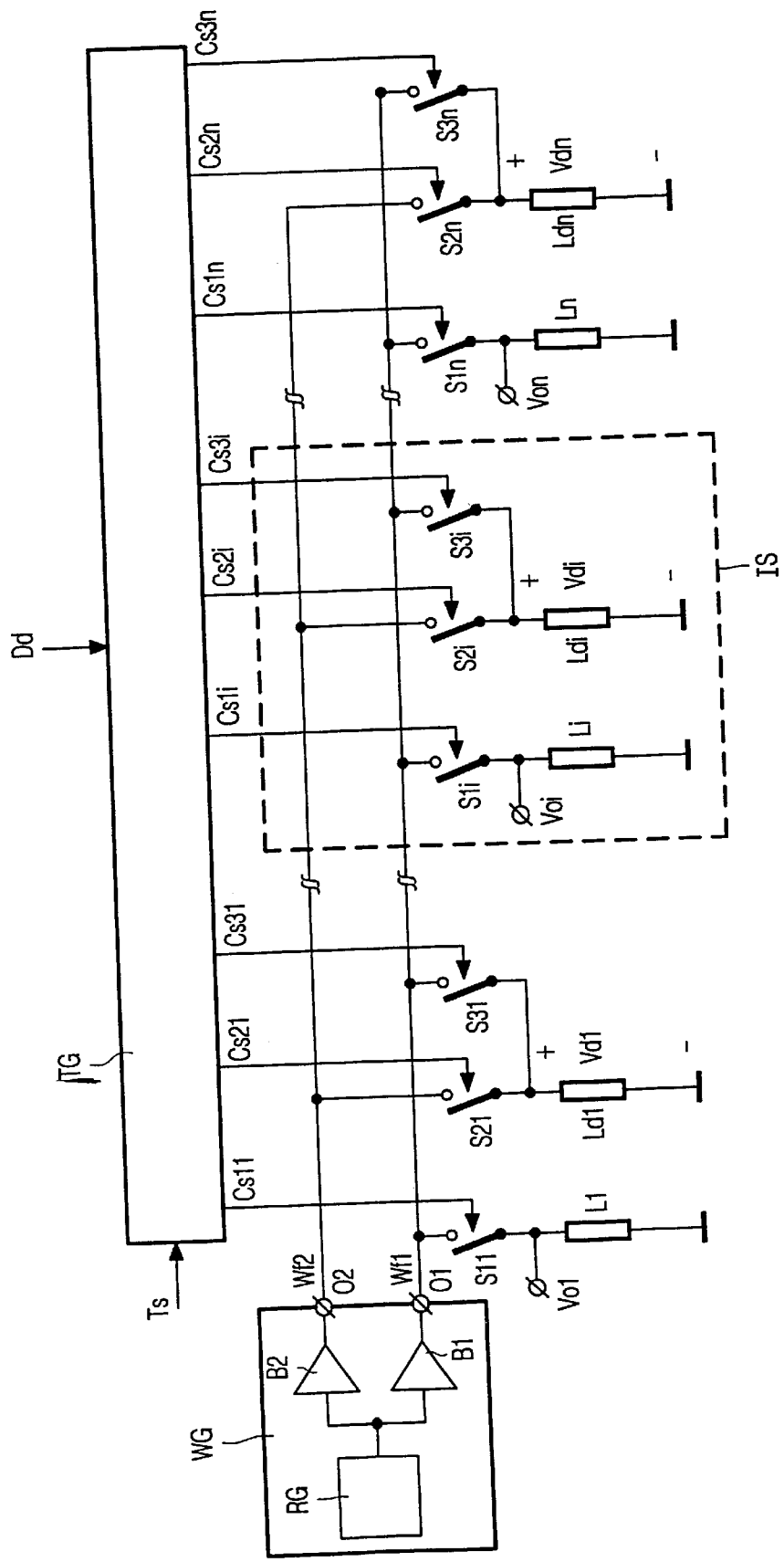
FIG. 1 shows a block diagram of a multiple-output digital to analog converter according to the invention.

FIG. 1 shows a block diagram of a multiple-output digital to analog converter according to the invention. A waveform generator WG comprises a ramp generator RG which supplies a first waveform Wf1 at a first output O1 via a first buffer B1, and a second waveform Wf2 at a second output O2 via a second buffer B2. A plurality of loads L1, . . . , Ln is connected to the first output O1, each via an associated switch S11, . . . , S1n. A timing generator TG controls each of the switches S11, . . . , S1n with an associated control signal Cs11, . . . , Cs1n. A plurality of dummy loads Ld1, . . . , Ldn is connected to the second output O2, each via an associated switch S21, . . . , S2n. The timing generator TG controls each of the switches S21, . . . , S2n with an associated control signal Cs21, . . . , Cs2n. The plurality of dummy loads Ld1, . . . , Ldn is connected to the first output O1, each via an associated switch S31, . . . , S3n. The timing generator TG controls each of the switches S31, ..., S3n with an associated control signal Cs31, ..., Cs3n. The timing generator TG determines the control signals Csij in dependence on a timing input signal Ts and digital input data Dd which represents the output voltages Vo1, ..., Von to be generated across the loads L1, ..., Ln, respectively. The voltages across the dummy loads Ld1, ..., Ldn are denoted by Vd1, ..., Vdn, respectively.

Figure 2:
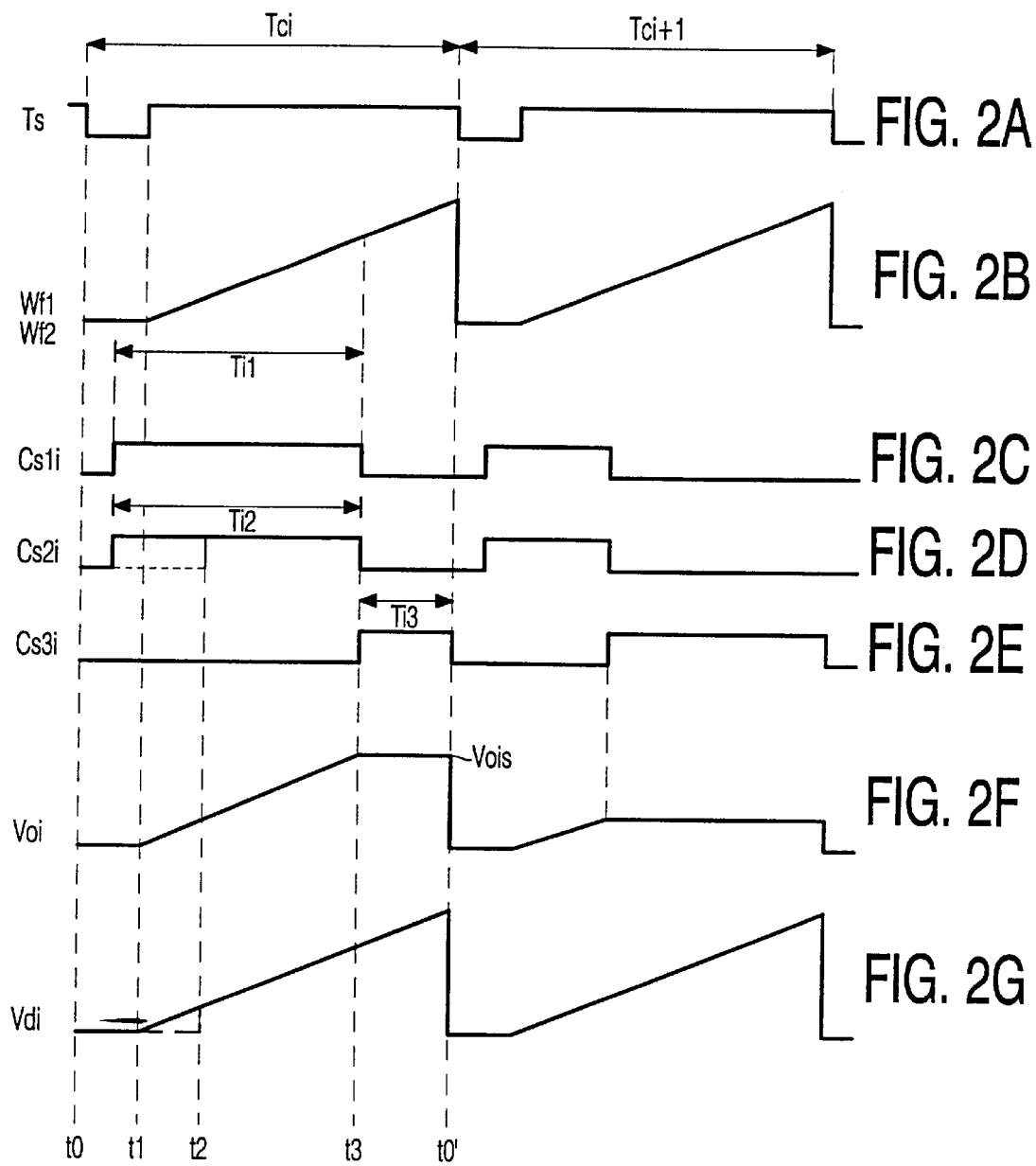
FIG. 2 shows voltage waveforms occurring with respect to the multiple-output digital to analog converter according to FIG. 1.

The operation of the multiple-output digital to analog converter is elucidated with reference to FIG. 2.

FIG. 2 shows voltage waveforms occurring with respect to the multiple-output digital to analog converter according to FIG. 1. FIG. 2A shows the timing input signal Ts. FIG. 2B shows the first and second waveform signals Wf1 and Wf2. FIGS. 2C, 2D, 2E show a control signal Cs1i, Cs2i, Cs3i, respectively. A high level indicates a closed switch Sji, a low level an open switch Sji. FIG. 2F shows the analog output voltage Voi across the load Li, and FIG. 2G shows the voltage Vdi across the dummy load Ldi.

The timing input signal Ts determines the timing of the control signals Csji in the conversion periods Tci. FIG. 2 shows a situation in which during each conversion period Tci, the analog output voltages Voi are generated across the loads Li in conformity with the digital input data Dd. In an embodiment according to the invention (see FIG. 3) wherein the loads are display elements Dji of a selected row Rj of a matrix display, the digital data Dd is converted for every selected row Rj of display elements Dji into the corresponding analog output voltages Voji. The analog voltages Voji generated across the display elements Dji of a certain row keep their values constant until the certain row is selected again after a field period wherein all rows have been successively selected.

In the following a description is given of how the output voltage Voi across the load Li of the i-th section IS of FIG. 1 is generated during the conversion period denoted by Tci. It has to be noted that in a multiple-output ramping digital to analog converter according to the invention, a plurality of output voltages Voi is generated during one conversion period Tci. The conversion period Tci starts at instant t0. During the low level of the timing input signal Ts, both waveforms Wf1 and Wf2 are set to their starting value. At instant t1, the switches S1i and S2i are closed, and the switch S3i is open and the waveforms Wf1 and Wf2 start ramping. As shown in FIG. 2B the waveforms Wf1 and Wf2 are identical and represent voltages. The digital input data Dd related to the conversion period Tci determines the period in time Ti1 during which the switch S1i is closed. At instant t3 the switch S1i opens and the output voltage Voi stops varying according to the ramping waveform Wf1 as shown in FIG. 2F. The stable value Vois of the output voltage Voi is one of the multiple output voltages Voi generated by the multiple-output digital to analog converter. The stable value Vois is available until a next digital to analog conversion for the i-th section occurs. In a preferred embodiment all output voltages Voi are generated in one conversion period Tci, and a next digital to analog conversion for the i-th section occurs in the succeeding conversion period Tci+1. The instant at which the switch S1i is closed during the low level of the timing input signal Ts is not essential. It is even possible to close the switch S1i after the instant t1. The switch S1i has to be closed at an instant occurring sufficiently long before the instant t3 to enable to reach the level Vois.

In FIG. 2D, the switch S2i in series with the dummy load Ldi is closed during the time period Ti2 during which the switch S1i is closed. Consequently, the voltage across the dummy load Ldi varies according to the waveform Wf2 from instant t1 to t3. At instant t3, the switch S2i is opened and the switch S3i is closed, the dummy load Ldi is connected to the first output O1 during a period of time Ti3. Consequently, the voltage Vdi across the dummy load Ldi varies according to the waveform Wf1 until the end of the conversion period Tci at instant t0'. A next conversion period Tci+1 starts at t0'. The first output O1 has a constant load; because the dummy load Ldi is connected to the first output O1 at the instant t3 when the load Li is disconnected from the first output O1. The waveform Wf1 will be substantially undisturbed because, at the instant t3, the voltage Vdi across the dummy load Ldi is substantially equal to the output voltage Voi across the load Li. Thus, even if in one conversion period Tci a lot of switches S1i open at a same instant, the waveform Wf1 will be substantially undisturbed, and the output voltage Voi across a load Ldi of which the corresponding switch S1i opens at an instant very shortly after the instant the plurality of switches S1i opens has the correct value.

Although the disturbance is optimally suppressed if the voltage Vdi across the dummy load Ldi is equal to the output voltage Voi across the associated load Li at the switching instant t3, the disturbance will be suppressed to a high degree if the voltage Vdi across the dummy load Ldi is close to the output voltage Voi. It is possible to close switch S2i at any time in the period t1 to t3. This causes a disturbance of the waveform Wf2 which might influence the voltage across a dummy load Ldi which has to be connected to the first output O1 at that instant. But, still, although the voltage across the dummy load Ldi is not exactly equal to the voltage across the load Li, the disturbance on the output O1 will be much smaller. The switch S2i need not be opened at exactly the instant t3. If the switch S2i is opened somewhat earlier than at instant t3 the voltage across the dummy load Ldi is only slightly too low.

It is possible to generate the waveforms Wf1 and Wf2 as currents. If the current supplied by output O2 is larger than the current supplied by output O1, both waveforms have the same shape but different amplitudes. The voltage Voi across the dummy load Ldi is substantially equal to the voltage Vdi across the load Li if the impedances of the dummy load Ldi and the load Li are selected in the correct ratio. On the other hand, the difference between the values of the dummy load Ldi and the load Li should not be selected too large, otherwise then the load on the first output O1 would vary too much at the switching instant t3.

In a preferred embodiment, the control signals Cs1i and Cs2i are identical, and the control signal Cs3 is an inverted control signal Cs1.

Figure 3:
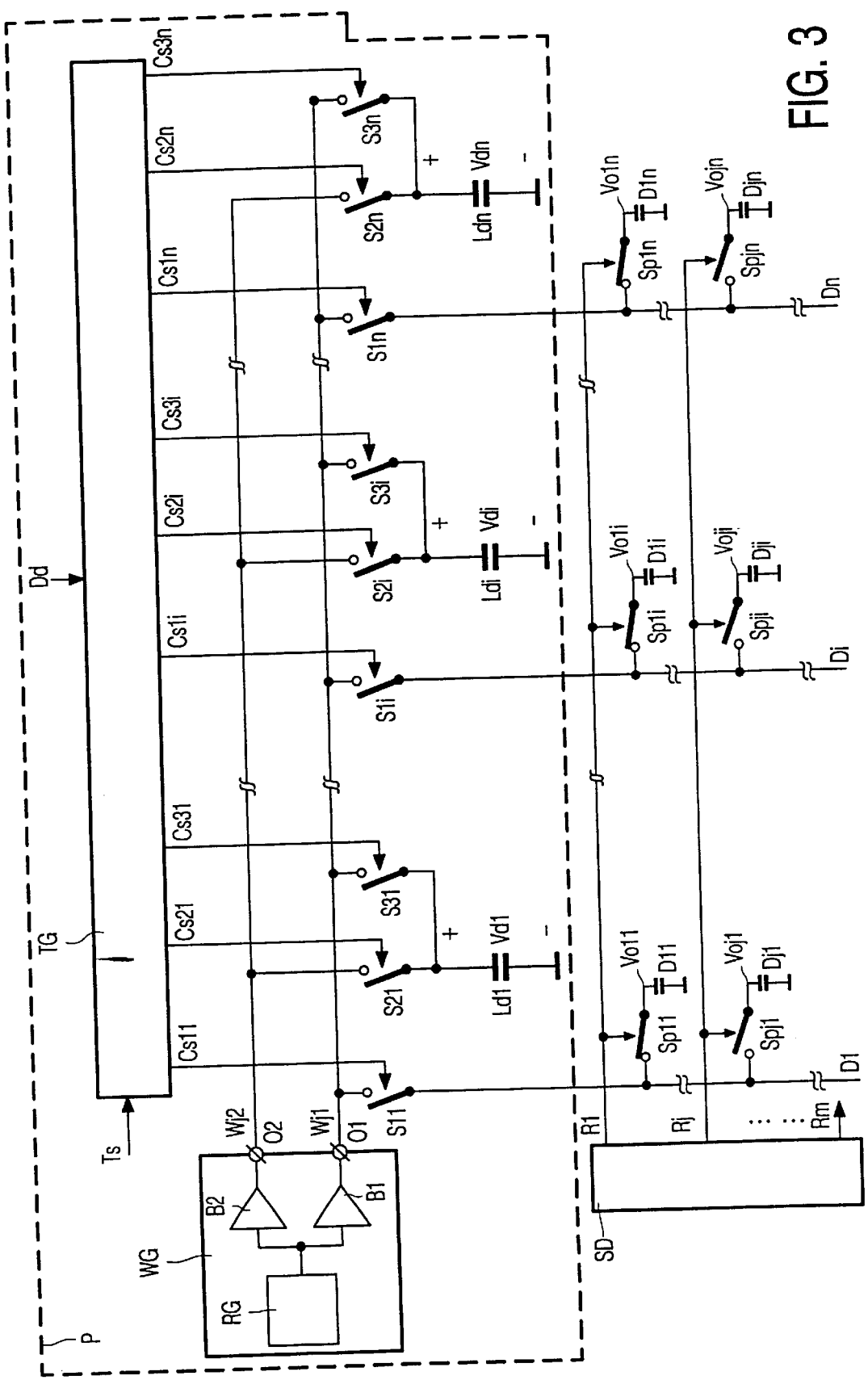
FIG. 3 shows a block diagram of a matrix display with a multiple-output digital to analog converter according to the invention.

FIG. 3 shows a block diagram of a matrix display with a multiple-output digital to analog converter according to the invention. The matrix display comprises a plurality of display elements Dji associated with intersections of select lines Rj and data lines Di. Each display element Dji is connected via a selection switch Spji to an associated data line Di. The selection switch Spji is controlled by the associated select line Rj. A selection driver SD supplies selection signals to the select lines Rj to select the select lines Rj one by one. The data lines Di are connected to corresponding display elements Dji associated with the selected select line Rj (all selection switches Spji associated with the selected select line Rj are closed). The part of the circuit within the dashed line P is identical to the circuit shown in FIG. 1 but without the loads Li. The same elements are denoted by the same references. The loads Li are now the display elements Dji associated with the selected select line Rj. For every selected select line Rj, the operation of the circuit of FIG. 3 is identical to the operation of the circuit of FIG. 1. The timing generator TG has to be adapted to sequentially convert the digital data Dd into a plurality of control signals Csji which are in conformity with the brightness of the display elements in the consecutively selected select lines Rj.

If the matrix display is a liquid crystal display, the display elements Dji have a capacitive behaviour, and the dummy loads Ldi are capacitors. According to this embodiment of the invention, the influence of disconnecting the display elements Dji from the first output O1 on the waveform Wf1 is substantially neglibile. Consequently, the voltage across the display elements Dji and thus the displayed brightness is substantially data-independent. Which means that the brightness displayed with respect to a display element Dji that is disconnected from the first output a short instant later than one or more other display elements Dji is substantially uninfluenced.

While the invention has been described in connection with preferred embodiments, it will be understood that modifications thereof within the principles outlined above will be evident to those skilled in the art and thus the invention is not limited to the preferred embodiments but is intended to encompass such modifications.

Although the waveforms Wf1 and Wf2 are shown to be sawtooth-shaped, any other shape may be suitable, however a monotonous rising or falling function is preferred. The functions shown in the embodiments might be realized with discrete circuits or by a suitably programmed computer. For example, the waveform generator may comprise a digital to analog converter for converting a series of digital words into the analog waveforms Wf1, Wf2.

In the claims, any reference signs placed between parenthesis shall not be construed as limiting the scope of the claims.

In summary, in a preferred embodiment of the invention, a multiple-output digital to analog converter comprises a waveform generator WG with a first output O1 to supply a first waveform Wf1 to a plurality of loads Li via a plurality of switching elements Si, each switching element Si are coupled to an associated load Li. A timing generator TG converts digital input data Dd into a plurality of control signals Csi determining time periods T1i during which corresponding switching elements Si are closed. Output voltages Voi across the associated loads Li vary according to the first waveform Wf1 until an associated switching element Si opens in conformity with the digital input data Dd. The waveform generator WG comprises a second output O2 to supply a second waveform Wf2 of substantially the same shape as the first waveform Wf1. The multiple-output digital to analog converter further comprises a plurality of dummy loads Ldi, each one of the dummy loads Ldi is associated with one of the loads Li. The dummy loads Ldi are coupled to the second output O2 during the time periods Ti2 during which the corresponding switching elements Si are closed. In this way, the supply voltages Vdi across the dummy loads Ldi are substantially equal to the output voltages Voi across the associated loads Li. The dummy loads Ldi are coupled to the first output O1 when the corresponding switching elements Si are open. In this way, the load on the first output O1 is substantially constant.

What is claimed is:

1. A multiple-output digital to analog converter for converting digital input data into a plurality of analog output voltages across associated loads comprising:

a timing generator for generating time periods in dependence on the digital input data, means for supplying a waveform signal (Wf1), means for coupling the loads, each during an associated one of the time periods (Ti1), to the waveform signal to obtain the plurality of analog output voltages at ends of the associated time periods (Ti1), at least one dummy load associated to a corresponding one of the loads, means for coupling the at least one dummy load to the waveform signal when the means for coupling decouples the corresponding one of the loads from the waveform signal, and means for generating a dummy voltage across the at least one dummy load, the dummy voltage being substantially equal to the analog output voltage across the corresponding one of the loads at an instant when the means for coupling decouples the corresponding one of the loads.

2. A multiple-output digital to analog converter as claimed in claim 1, characterized in that the means for generating the dummy voltage across the at least one dummy load comprise:

means for supplying a further waveform signal having substantially the same shape as the first waveform signal (Wf1), and means for coupling the at least one dummy load to the further waveform signal (Wf2) during at least part of the time period (Ti1) during which the associated one of the loads is coupled to the waveform signal (Wf1).

3. A multiple-output digital to analog converter as claimed in claim 1, characterized in that a respective dummy load is associated with each one of the loads.

4. A multiple-output digital to analog converter as claimed in claim 2, characterized in that it further comprises a ramp generator for supplying a ramp signal both to the means for supplying the waveform signal (Wf1) and to the means for supplying the further waveform signal (Wf2).

5. A multiple-output digital to analog converter as claimed in claim 1, characterized in that the means for supplying the waveform signal (Wf1) supply the waveform signal (Wf1) at an output, the means for coupling the loads to the waveform signal (Wf1) comprise switching elements, each one of the switching elements being coupled between the output and an associated one of the loads, and the timing generator is adapted to convert the digital input data into a plurality of control signals determining the time periods (Ti1) during which corresponding ones of the switching elements are closed.

6. A multiple-output digital to analog converter as claimed in claim 1, characterized in that, the means for supplying the waveform signal (Wf1) supply the waveform signal (Wf1) at an output, the means for coupling the at least one dummy load to the waveform signal comprises at least one switching element coupled between the output and the at least one dummy load, and the timing generator is adapted to convert the digital input data into a control signal determining a further time period (Ti3) during which the one switching element is closed.

7. A multiple-output digital to analog converter as claimed in claim 2, characterized in that, the means for supplying the further waveform signal (Wf2) are adapted to supply the further waveform signal at an output, the means for coupling the at least one dummy load to the further waveform signal (Wf2) comprises at least one switching element coupled between the output and the at least one dummy load, and the timing generator is adapted to convert the digital input data into a control signal determining a further time period (Ti2) during which the one switching element is closed.

8. A method of converting digital input data into a plurality of analog output across associated loads, the method comprising the steps of:

generating time periods (Ti1) in dependence on the digital input data, supplying a waveform signal (Wf1), coupling the loads, each during an associated one of the time periods, to the waveform signal (Wf1) to obtain the plurality of analog output voltages at ends of the associated time periods (Ti1), coupling (S2i) at least one dummy load to the waveform signal (Wf1) when the step of coupling decouples a corresponding one of the loads from the waveform signal (Wf1), and generating a voltage across the at least one dummy load which is substantially equal to the analog output voltage across the corresponding one of the loads at an instant the step of coupling decouples the corresponding one of the loads.

9. A matrix display with a plurality of display elements (Dji) associated with intersections of select lines (Rj) and data lines (Di), and a multiple-output digital to analog converter for converting digital input data into a plurality of output voltages across associated selected display elements corresponding to a selected select line, said converter comprising:

a timing generator for generating time periods (Ti1) in dependence on the digital input data, means for supplying a waveform signal (Wf1), means for coupling the selected display elements (Dji), each during an associated one of the time periods (Ti1), to the waveform signal (Wf1) to obtain the plurality of output voltages at ends of the associated time periods (Ti1), a plurality of dummy loads (Ldi), each one of the dummy loads being associated with a corresponding one of the selected display elements (Dji), means for coupling each one of the plurality of dummy loads to the waveform signal (Wf1) when the means for coupling decouples the corresponding one of the selected display elements from the waveform signal, and means for generating dummy voltages across the dummy loads, each of the dummy voltages being substantially equal to the output voltage across the corresponding selected display element (Dji) at an instant the means for coupling decouples the corresponding one of the selected display elements.

10. A matrix display as claimed in claim 9, characterized in that one respective dummy load is associated with each one of the selected display elements.

11. A matrix display as claimed in claim 9, characterized in that the display elements have a capacitive behaviour, and in that the dummy loads are capacitors.

* * * * *